(12) United States Patent
Furukubo et al.

(10) Patent No.: US 12,046,868 B2
(45) Date of Patent: Jul. 23, 2024

(54) SUBSTRATE FOR MOUNTING A LIGHT-EMITTING ELEMENT AND LIGHT-EMITTING DEVICE

(71) Applicant: KYOCERA Corporation, Kyoto (JP)

(72) Inventors: Youji Furukubo, Kirishima (JP); Masanori Annoura, Kirishima (JP); Takeshi Kawakami, Tokyo (JP)

(73) Assignee: KYOCERA CORPORATION, Kyoto (JP)

( * ) Notice: Subject to any disclaimer, the term of this patent is extended or adjusted under 35 U.S.C. 154(b) by 956 days.

(21) Appl. No.: 16/977,901

(22) PCT Filed: Mar. 6, 2019

(86) PCT No.: PCT/JP2019/008944
§ 371 (c)(1),
(2) Date: Sep. 3, 2020

(87) PCT Pub. No.: WO2019/172336
PCT Pub. Date: Sep. 12, 2019

(65) Prior Publication Data
US 2021/0044084 A1    Feb. 11, 2021

(30) Foreign Application Priority Data

Mar. 8, 2018    (JP) .................................. 2018-042165

(51) Int. Cl.
*H01S 5/023* (2021.01)
*H01S 5/022* (2021.01)
(Continued)

(52) U.S. Cl.
CPC .............. *H01S 5/023* (2021.01); *H01S 5/022* (2013.01); *H01S 5/0233* (2021.01); *H01S 5/0235* (2021.01)

(58) Field of Classification Search
CPC ........ H01S 5/023; H01S 5/022; H01S 5/0233; H01S 5/0235; H01S 5/0237;
(Continued)

(56) References Cited

U.S. PATENT DOCUMENTS

2005/0049905 A1*  3/2005  Olesen ................. G06Q 10/087
                                            705/28
2005/0146016 A1*  7/2005  Natarajan ........... H01L 21/4857
                                            257/E23.07
(Continued)

FOREIGN PATENT DOCUMENTS

JP    06-112652 A    4/1994
JP    09-237854 A    9/1997
(Continued)

*Primary Examiner* — Xinning(Tom) Niu
(74) *Attorney, Agent, or Firm* — Volpe Koenig

(57) ABSTRACT

A substrate for mounting a light-emitting element includes a substrate that is composed of a ceramic(s), a terminal for an element that is provided on a front surface of the substrate where a light-emitting element is mounted thereon, a terminal for a power source that is provided on the substrate where an external power source is connected thereto, and a wiring part that is provided inside the substrate and electrically connects the terminal for an element and the terminal for a power source. Furthermore, the wiring part includes a first conductor that extends in a surface direction of the substrate and a second conductor that extends substantially parallel to the first conductor on an opposite side of the front surface and is connected in parallel with the first conductor.

11 Claims, 11 Drawing Sheets

(51) Int. Cl.
*H01S 5/0233* (2021.01)
*H01S 5/0235* (2021.01)

(58) Field of Classification Search
CPC ..... H01S 5/0239; H01L 33/486; H01L 33/62; H05K 1/0306; H05K 1/113; H05K 3/4629; H05K 2201/09627; H05K 2201/10106; H05K 1/0265; H05K 2201/0979

See application file for complete search history.

(56) References Cited

U.S. PATENT DOCUMENTS

| | | | | |
|---|---|---|---|---|
| 2007/0045816 | A1* | 3/2007 | Natarajan | H05K 1/0265 257/E23.07 |
| 2007/0284597 | A1* | 12/2007 | Nawashiro | H01L 33/486 257/89 |
| 2008/0192787 | A1* | 8/2008 | Yamamoto | H01S 5/4031 372/44.01 |
| 2010/0147568 | A1* | 6/2010 | Nomiya | H01L 23/15 174/257 |
| 2012/0033696 | A1* | 2/2012 | Hayashi | H01S 5/0232 372/43.01 |
| 2012/0061692 | A1* | 3/2012 | Chang | H01L 33/08 257/E27.12 |
| 2017/0064814 | A1 | 3/2017 | Kawaguchi | |
| 2019/0214784 | A1 | 7/2019 | Yamamoto et al. | |

FOREIGN PATENT DOCUMENTS

| | | | |
|---|---|---|---|
| JP | 09237854 A | * | 9/1997 |
| JP | 2006-351647 A | | 12/2006 |
| JP | 2010-199167 A | | 9/2010 |
| JP | 2017-050429 A | | 3/2017 |
| WO | 2018/030486 A1 | | 2/2018 |

* cited by examiner

SUBSTRATE FOR MOUNTING A LIGHT-EMITTING ELEMENT AND LIGHT-EMITTING DEVICE

CROSS-REFERENCE TO RELATED APPLICATION(S)

This application is a national stage application of International Application No. PCT/JP2019/008944, filed on Mar. 6, 2019, which designates the United States, the entire contents of which are herein incorporated by reference, and which is based upon and claims the benefit of priority to Japanese Patent Application No. 2018-042165, filed on Mar. 8, 2018, the entire contents of which are herein incorporated by reference.

FIELD

Disclosed embodiments relate to a substrate for mounting a light-emitting element and a light-emitting device.

BACKGROUND

A substrate that has a light-emitting element connection terminal pad and an external connection terminal pad that are formed on an insulated substrate and a conductor wiring that is formed on the insulated substrate and is electrically connected between both such pads has conventionally been known as a substrate for mounting a light-emitting element to mount a light-emitting element (see, for example, Patent Literature 1).

CITATION LIST

Patent Literature

Patent Literature 1: Japanese Patent Application Publication No. 2010-199167

SUMMARY

A substrate for mounting a light-emitting element according to an aspect of an embodiment includes a substrate that is composed of a ceramic(s), a terminal for an element that is provided on a front surface of the substrate where a light-emitting element is mounted thereon, a terminal for a power source that is provided on the substrate where an external power source is connected thereto, and a wiring part that is provided inside the substrate and electrically connects the terminal for an element and the terminal for a power source. Furthermore, the wiring part has a first conductor that extends in a surface direction of the substrate, and a second conductor that extends in substantially parallel to the first conductor on an opposite side of the front surface and is connected in parallel with the first conductor.

Furthermore, a light-emitting device according to an aspect of an embodiment includes the substrate for mounting a light-emitting element as described above, and a light-emitting element that is mounted on the terminal for an element of the substrate for mounting a light-emitting element.

DESCRIPTION OF EMBODIMENTS

In a conventional technique as described above, it is difficult to reduce an inductance of a wiring conductor, so that a pulse waveform may decay from a rectangular shape when a light-emitting element is pulse-driven by an external power source. Hence, a great variation in an output of light emission of a light-emitting element may be caused. An aspect of an embodiment as illustrated below is provided by taking the above into consideration.

Hereinafter, embodiments of a substrate for mounting a light-emitting element and a light-emitting device as disclosed in the present application will be explained with reference to the accompanying drawings. Additionally, this invention is not limited to a substrate for mounting a light-emitting element or a light-emitting device, and it goes without saying that it is possible to apply it to a substrate or device that mounts a general electrical element that has a heat generation property, other than a light-emitting element.

Herein, for an electrical element that has a heat generation property, it is possible to provide a large scale integrated circuit (LSI: Large Scale Integrated circuit), a charge coupled device (CCD: Charge Coupled Device), a laser diode (Laser Diode), a light-emitting diode (LED: Light Emitting Diode), and the like. An embodiment as illustrated below is useful, inter alia, for a laser diode.

EMBODIMENTS

Figure 1A:
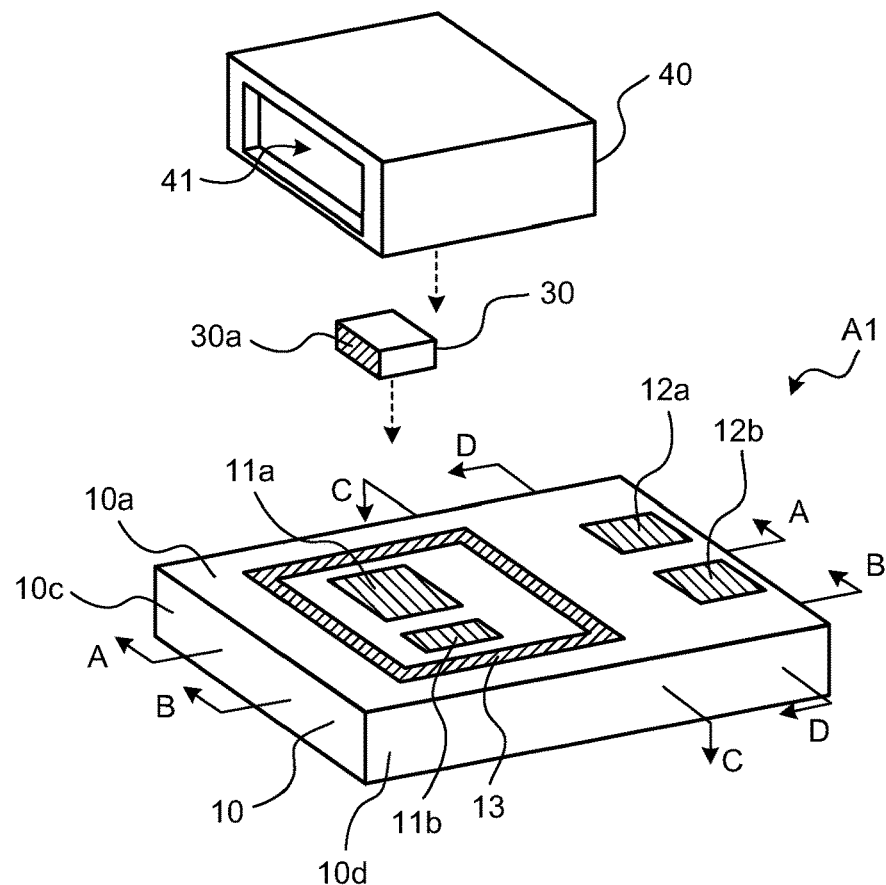
FIG. 1A is a perspective view of a substrate for mounting a light-emitting element according to an embodiment.

First, an outlie of a substrate for mounting a light-emitting element A1 according to an embodiment will be explained with reference to FIG. 1A to FIG. 1E. As illustrated in FIG. 1A, a substrate for mounting a light-emitting element A1 according to an embodiment includes a substrate 10 with a flat plate shape that is composed of a ceramic(s). Furthermore, terminals for an element 11a, 11b that are composed of a metal are provided on a front surface 10a of such a substrate 10. Furthermore, terminals for a power source 12a, 12b are provided on the substrate 10. Additionally, in such a case, although FIG. 1A illustrates a structure where the terminals for an element 11a, 11b and the terminals for a power source 12a, 12b are provided on the front surface 10a of the substrate 10, the front surface 10a of the substrate 10 is not limiting and the terminals for a power source 12a, 12b may be provided on an end surface 10c or a side surface 10d of the substrate 10.

The terminal for an element 11a is a terminal where a light-emitting element 30 is mounted thereon. The terminal for an element 11b is a terminal where the light-emitting element 30 that is mounted on the terminal for an element 11a is connected thereto by a bonding wire or the like. Furthermore, the terminals for a power source 12a, 12b are terminals where a non-illustrated external power source is connected thereto.

Then, as illustrated in FIG. 1B to FIG. 1E, the terminal for an element 11a and the terminal for a power source 12a are electrically connected through a wiring part 14a and the terminal for an element 11b and the terminal for a power source 12b are electrically connected through a wiring part 14b.

Figure 1B:
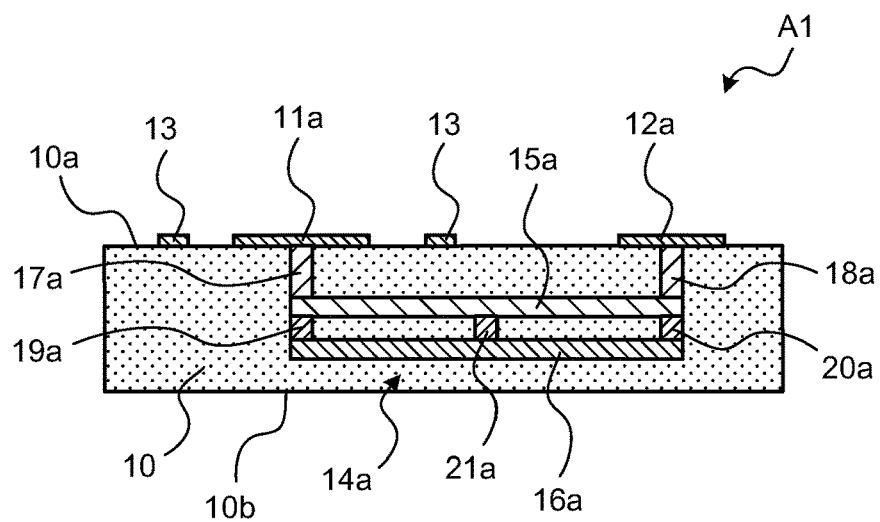
FIG. 1B is a cross-sectional view that is viewed along an arrow of line A-A as illustrated in FIG. 1A.

As illustrated in FIG. 1B, the wiring part 14a is formed inside the substrate 10 and has a first conductor 15a, a second conductor 16a, a first via conductor 17a, a second via conductor 18a, a third via conductor 19a, and a fourth via conductor 20a.

Figure 1C:
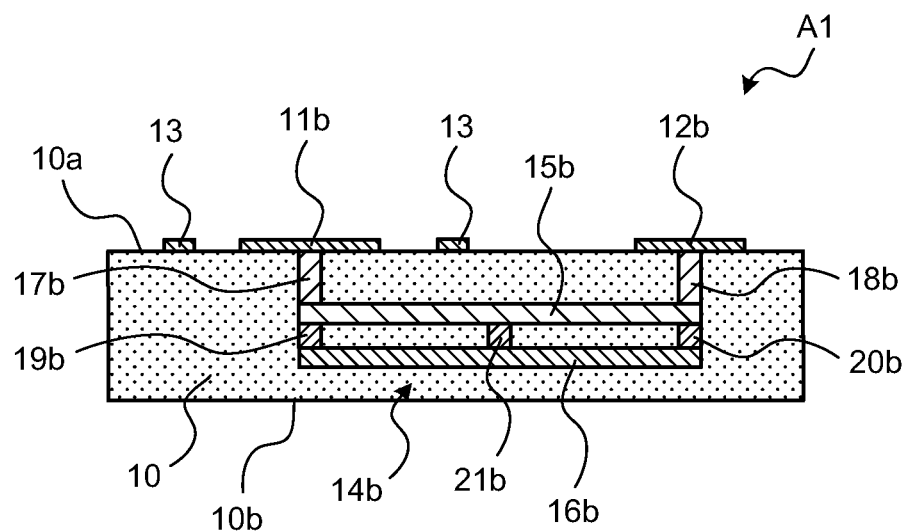
FIG. 1C is a cross-sectional view that is viewed along an arrow of line B-B as illustrated in FIG. 1A.
Figure 1D:
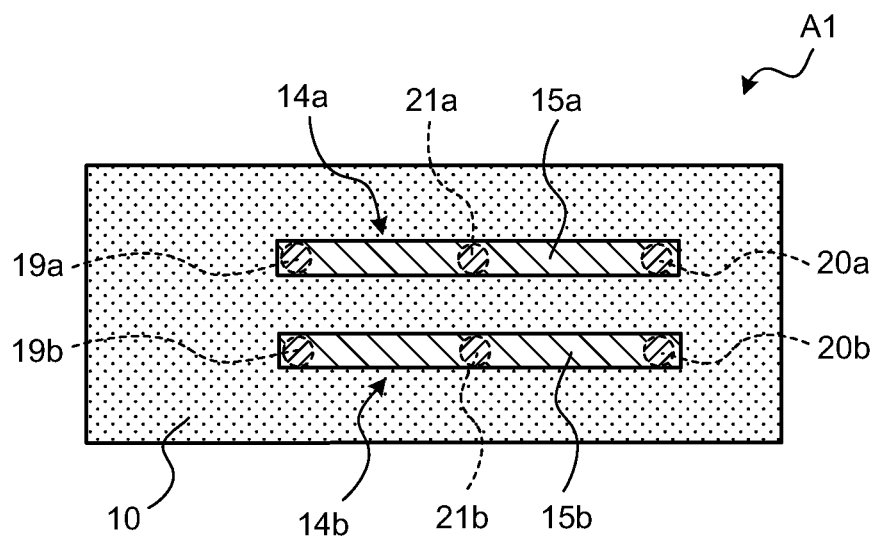
FIG. 1D is a cross-sectional view that is viewed along an arrow of line C-C as illustrated in FIG. 1A.

Furthermore, as illustrated in FIG. 1C, the wiring part 14b is also formed inside the substrate 10 and has a first conductor 15b, a second conductor 16b, a first via conductor 17b, a second via conductor 18b, a third via conductor 19b, and a fourth via conductor 20b.

Additionally, the wiring part 14b has a configuration similar to that of the wiring part 14a, so that a configuration of the wiring part 14a will be explained in the following explanation and an explanation of the wiring part 14b will be omitted therein.

Any of the first conductor 15a and the second conductor 16a is composed of a metal and extends in a surface direction of the substrate 10 (that is, substantially parallel to the front surface 10a of the substrate 10). In other words, the first conductor 15a and the second conductor 16a extend so as to be along the front surface 10a of the substrate 10. Furthermore, any of the first conductor 15a and the second conductor 16a extends in such a manner that one end side thereof reaches a lower side of the terminal for an element 11a, and extends in such a manner that another end side thereof reaches a lower side of the terminal for a power source 12a. That is, the first conductor 15a and the second conductor 16a are arranged side by side inside the substrate in a thickness direction thereof (that is, substantially perpendicular to the front surface 10a of the substrate 10). Herein, "being composed of a metal" means that, for example, a ceramic(s) other than a metal may be included partially. A similar meaning also applies below.

Furthermore, the second conductor 16a is arranged on an opposite side of the front surface 10a with respect to the first conductor 15a. That is, the second conductor 16a is arranged so as to be more distant from the front surface 10a than the first conductor 15a.

Any of the first via conductor 17a to the fourth via conductor 20a is composed of a metal and extends in a thickness direction of the substrate 10. The first via conductor 17a is arranged on a lower side of the terminal for an element 11a and is connected between such a terminal for an element 11a and the first conductor 15a. The second via conductor 18a is arranged on a lower side of the terminal for a power source 12a and is connected between such a terminal for a power source 12a and the first conductor 15a.

The third via conductor 19a is arranged on a lower side of the terminal for an element 11a and is connected between the first conductor 15a and the second conductor 16a. The fourth via conductor 20a is arranged on a lower side of the terminal for a power source 12a and is connected between the first conductor 15a and the second conductor 16a.

As explained thus far, the wiring part 14a has a wiring that sequentially wire-connects the first via conductor 17a, the first conductor 15a, and the second via conductor 18a and a wiring that sequentially wire-connects the first via conductor 17a, the first conductor 15a, the third via conductor 19a, the second conductor 16a, the fourth via conductor 20a, the first conductor 15a, and the second via conductor 18a. That is, the wiring part 14a where wirings are formed in parallel is connected between the terminal for an element 11a and the terminal for a power source 12a.

Thereby, it is possible to reduce a wiring inductance of the wiring part 14a as compared with a case where the wiring part 14a is a wiring that is a single wire. Therefore, according to an embodiment, it is possible to maintain a pulse waveform in a state that is close to a rectangular shape when the light-emitting element 30 is pulse-driven by an external power source that is connected to the terminals for a power source 12a, 12b, so that it is possible to prevent or reduce a variation in an output of light emission in the light-emitting element 30.

Furthermore, in an embodiment, it is possible to increase a cross-sectional area of a site of the wiring part 14a that extends in a surface direction (that is, the first conductor 15a and the second conductor 16a). Therefore, according to an embodiment, it is possible to reduce a wiring resistance of the wiring part 14a.

Figure 1E:
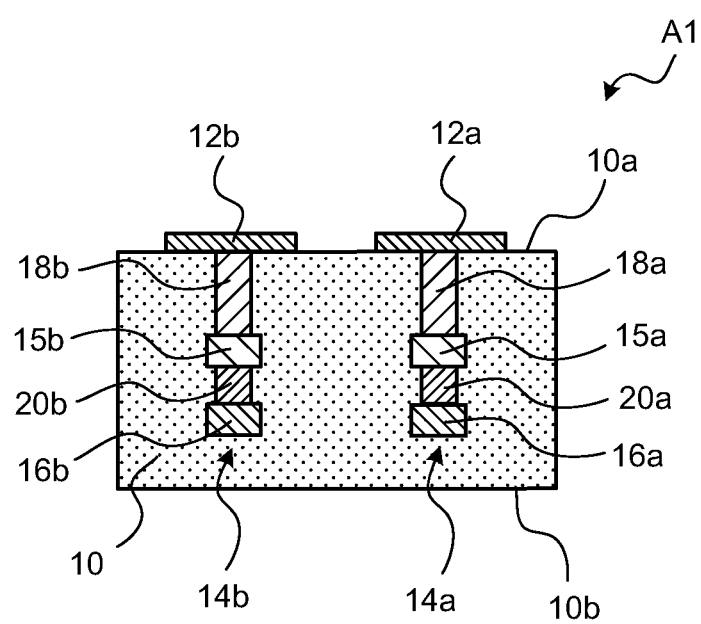
FIG. 1E is a cross-sectional view that is viewed along an arrow of line D-D as illustrated in FIG. 1A.

Furthermore, in an embodiment, as illustrated in FIG. 1E, the first conductor 15a and the second conductor 16a are arranged in such a manner that both parts with a less thickness face one another in upward and downward directions. Thereby, it is possible to provide the first conductor 15a and the second conductor 16a closely in a thickness direction of the substrate 10. Therefore, according to an embodiment, it is possible to further reduce a wiring resistance of the wiring part 14a.

Furthermore, in an embodiment, as illustrated in FIG. 1B, a ceramic site of the substrate 10 is present between the first conductor 15a and the second conductor 16a. If the first conductor 15a and the second conductor 16a are integrated and the wiring part 14a is composed of a thick conductor that extends in a surface direction, there is a great difference in a coefficient of thermal expansion between a thick conductor of a metal and the substrate 10 of a ceramic(s), so that a great stress may be generated between the thick conductor and the substrate 10. Therefore, in such a case, a reliability of the substrate for mounting a light-emitting element A1 may be degraded.

However, in an embodiment, a site of the wiring part 14a that extends in a surface direction is divided into the first conductor 15a and the second conductor 16a and a ceramic site is present therebetween, so that it is possible to reduce a stress that is generated between a set of the first conductor 15a and the second conductor 16a and the substrate 10. Therefore, according to an embodiment, it is possible to improve a reliability of the substrate for mounting a light-emitting element A1.

Furthermore, in an embodiment, it is possible to arrange the second conductor 16a with a high thermal conductivity at a position that is close to a back surface 10b of the substrate 10. Additionally, the back surface 10b is a surface of the substrate 10 on an opposite side of the front surface 10a.

Thereby, it is possible to cause heat that is generated from the light-emitting element 30 that is mounted on the terminal for an element 11a to efficiently escape to the back surface 10b with a large surface area and a high heat release property through the first via conductor 17a, the third via conductor 19a, and the second conductor 16a that extend in a thickness direction. Therefore, according to an embodiment, for example, in a case where a heat release member of a fin type or the like is placed on the back surface 10b, it is possible to increase a thermal conductivity to such a heat release member.

Furthermore, in an embodiment, in a case where the substrate 10 is provided in a top view, the first via conductor 17a and the third via conductor 19a are arranged at substantially identical positions, and the second via conductor 18a and the fourth via conductor 20a are arranged at substantially identical positions. Thereby, it is possible to increase lengths of sites of the wiring part 14a that are connected in parallel by the first conductor 15a and the second conductor 16a. Therefore, according to an embodiment, it is possible to further reduce a wiring resistance of the wiring part 14a.

Herein, the first via conductor 17a and the third via conductor 19a being arranged at substantially identical positions refers to a state where a site that overlaps in a thickness direction of the substrate 10 is present between the first via conductor 17a and the third via conductor 19a. A similar matter is also applied between the second via conductor 18a and the fourth via conductor 20a. Furthermore, it is preferable that lengths of the first conductor 15a and the second conductor 16a are substantially equal. Herein, a length between the first conductor 15a and the second conductor 16a being substantially equal refers to a case where a difference in a length between the first conductor 15a and the second conductor 16a is less than or equal to a diameters of via conductors that are provided on both ends of such a first conductor 15a and a second conductor 16a. A diameter of a via conductor is a minimum diameter among diameters of the first via conductor 17a, the second via conductor 18a, the third via conductor 19a, and the fourth via conductor 20a.

Furthermore, in an embodiment, a via conductor other than the third via conductor 19a and the fourth via conductor 20a may be connected between the first conductor 15a and the second conductor 16a. For example, as illustrated in FIG. 1B, a fifth via conductor 21a may be connected between a middle part of the first conductor 15a and a middle part of the second conductor 16a. Thereby, it is possible to further equalize a current that flows through the first conductor 15a and a current that flows through the second conductor 16a.

Furthermore, as illustrated in FIG. 1C, a fifth via conductor 21b may be connected between a middle part of the first conductor 15b and a middle part of the second conductor 16b. Thereby, it is possible to further equalize a current that flows through the first conductor 15b and a current that flows through the second conductor 16b.

Furthermore, in an embodiment, it is preferable that any of the first conductor 15a and the second conductor 16a is arranged to be substantially parallel to the front surface 10a. Thereby, it is possible to arrange the first conductor 15a and the second conductor 16a more closely.

Subsequently, a more detailed configuration of the substrate for mounting a light-emitting element A1 will be explained with reference to FIG. 1A.

The substrate 10 is formed of a ceramic(s). For such a ceramic(s), for example, alumina, silica, mullite, cordierite, forsterite, aluminum nitride, silicon nitride, silicon carbide, a glass ceramic(s), or the like is suitable. Furthermore, it is preferable that the substrate 10 includes aluminum nitride (AlN) as a main component, from the viewpoint of a high thermal conductivity and a coefficient of thermal expansion that is close to that of the light-emitting element 30.

Herein, "including aluminum nitride as a main component" refers to the substrate 10 including 80% by mass or more of aluminum nitride. In a case where 80% by mass or more of aluminum nitride is included in the substrate 10, a thermal conductivity of the substrate for mounting a light-emitting element A1 is increased, so that it is possible to improve a heat release property thereof.

Moreover, it is preferable that the substrate 10 includes 90% by mass or more of aluminum nitride. As a content of aluminum nitride is 90% by mass or more, it is possible for a thermal conductivity of the substrate 10 to be 150 W/mK or greater, so that it is possible to realize the substrate for mounting a light-emitting element A1 with an excellent heat release property.

It is sufficient that the terminals for an element 11a, 11b are formed of a metallized film where a metal powder is sintered. It is possible to bond a metallized film to a ceramic surface that composes the substrate 10, with a high strength, so that it is possible to realize the substrate for mounting a light-emitting element A1 with a high reliability.

Furthermore, a plating film of Ni or the like may be formed on a surface of such a metallized film. Moreover, a solder or an Au—Sn plating film may be provided on a surface of such a plating film.

A metal film for sealing 13 is provided on the front surface 10a of the substrate 10 so as to surround the terminals for an element 11a, 11b. The metal film for sealing 13 is a site where, when a cap 40 is provided so as to cover the light-emitting element 30 that is mounted on the terminal for an element 11a, such a cap 40 is bonded thereto.

Furthermore, it is preferable that the terminals for a power source 12a, 12b are also metallized films similarly to the terminals for an element 11a, 11b, and further, a plating film may also be formed on the terminals for a power source 12a, 12b. Furthermore, it is preferable that the first via conductor 17a to the fourth via conductor 20a are also metallized films where a metal powder is fired.

A light-emitting device is configured in such a manner that the light-emitting element 30 and the cap 40 are mounted on the substrate for mounting a light-emitting element A1 as explained thus far.

For the light-emitting element 30, it is possible to use, for example, a semiconductor laser (that is also referred to as a laser diode) or the like. The light-emitting element 30 is arranged in such a manner that an emitting surface 30*a* that is provided on one end surface thereof is oriented in a predetermined direction of the substrate for mounting a light-emitting element A1.

The light-emitting element 30 is bonded to the terminal for an element 11*a* on the substrate 10 by using an electrically conductive bonding material such as a solder. In such a case, a (non-illustrated) first electrode that is provided on a bottom surface of the light-emitting element 30 and the terminal for an element 11*a* are electrically connected by such an electrically conductive bonding material.

Moreover, a (non-illustrated) second electrode that is provided on a top surface of the light-emitting element 30 and the terminal for an element 11*b* that is adjacent to the terminal for an element 11*a* are electrically connected by using a (non-illustrated) bonding wire or the like.

The cap 40 is a member for air-tightly sealing an area that is surrounded by the metal film for sealing 13, such as the light-emitting element 30. It is possible to provide the cap 40 that is composed of a metallic material, a ceramic(s), or the like, and it is sufficient that it is composed of, for example, kovar (an Fe—Ni—Co alloy) from the viewpoint of a heat resistance and a heat release property that are high.

A side window 41 is provided on a side surface of the cap 40 and a transparent glass is put in the side window 41. The cap 40 is arranged in such a manner that the side window 41 is oriented in a direction that is identical to that of the emitting surface 30*a* of the light-emitting element 30. Then, light that is emitted from the emitting surface 30*a* passes through the side window 41 and is emitted externally.

For bonding of the cap 40 and the metal film for sealing 13, it is preferable to use a wax material. As a wax material is used for a bonding material, it is possible to increase an airtightness of an area that is sealed by the cap 40, so that it is possible to improve a reliability of a light-emitting device.
Modifications Next, a variety of modifications of an embodiment will be explained with reference to FIG. 2 to FIG. 7B. Additionally, a component that is common to that of an embodiment as described above will be provided with an identical sign and a detailed explanation thereof will be omitted, in the following explanation.

Figure 2:
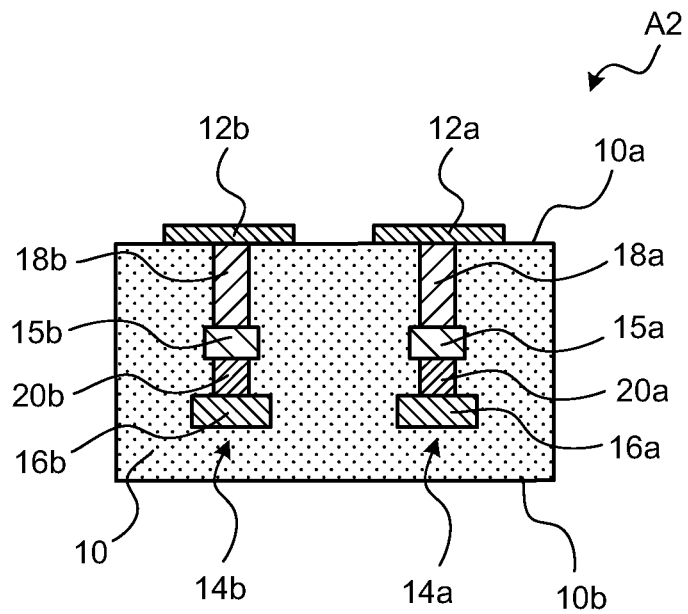
FIG. 2 is a cross-sectional view of a substrate for mounting a light-emitting element according to modification 1 of an embodiment.

A substrate for mounting a light-emitting element A2 as illustrated in FIG. 2 is modification 1 of an embodiment and FIG. 2 is a figure that corresponds to FIG. 1E. In modification 1 as illustrated in FIG. 2, a width of a second conductor 16*a* is greater than that of a first conductor 15*a*.

Thus, in modification 1, a width of the second conductor 16*a* is greater than that of the first conductor 15*a*, so that it is possible to cause heat that is generated from a light-emitting element 30 that is mounted on a terminal for an element 11*a* to escape to a back surface 10*b* with a high heat release property more efficiently.

Therefore, according to modification 1, in a case where a heat release member of a fin type or the like is placed on the back surface 10*b*, it is possible to further improve a heat conductivity to such a heat release member.

Furthermore, in modification 1, a width of the second conductor 16*a* is greater than that of the first conductor 15*a*, so that it is possible to further reduce a stress that is generated between a set of the first conductor 15*a* and the second conductor 16*a* and a substrate 10. Therefore, according to an embodiment, it is possible to further improve a reliability of the substrate for mounting a light-emitting element A2. This is caused by increasing of a rate of a metal with a near coefficient of thermal expansion at a position that is close to a heat release member on the substrate 10 in a case where such a heat release member is composed of a metal.

Figure 3:
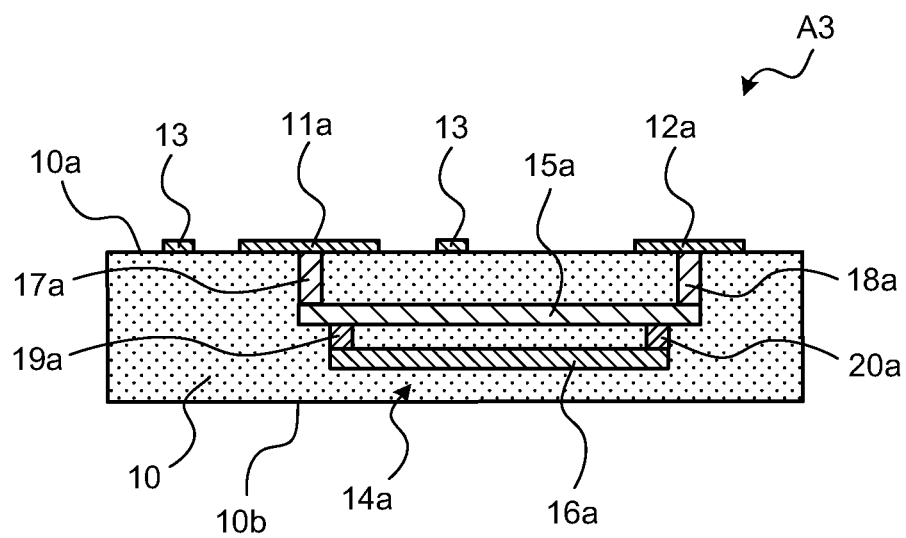
FIG. 3 is a cross-sectional view of a substrate for mounting a light-emitting element according to modification 2 of an embodiment.

A substrate for mounting a light-emitting element A3 as illustrated in FIG. 3 is modification 2 of an embodiment and FIG. 3 is a figure that corresponds to FIG. 1B. In modification 2 as illustrated in FIG. 3, in a case where a substrate 10 is provided in a top view, a first via conductor 17*a* and a third via conductor 19*a* are arranged at different positions and a second via conductor 18*a* and a fourth via conductor 20*a* are arranged at different positions.

Specifically, the third via conductor 19*a* is arranged on a side of a terminal for a power source 12*a* with respect to the first via conductor 17*a* and the fourth via conductor 20*a* is arranged on a side of a terminal for an element 11*a* with respect to the second via conductor 18*a*.

Thereby, at a part near the terminal for an element 11*a* or the terminal for a power source 12*a*, it is possible to provide a first conductor 15*a* at a part of a wiring part 14*a* that is close to the first via conductor 17*a* and the second via conductor 18*a*, with a single wire structure with an equal length or thickness. Therefore, according to modification 2, it is possible to prevent or reduce a variation of a pulsed current when a light-emitting element 30 is pulse-driven by an external power source.

Furthermore, in modification 2, when another mounting component such as an IC (Integrated Circuit) is packaged on a side of a front surface 10*a* or a side of a back surface 10*b* of the substrate 10, it is possible to increase a distance between a packaging surface and a second conductor 16*a*. Therefore, according to modification 2, it is possible to reduce an influence of a noise from another mounting component.

Figure 4:
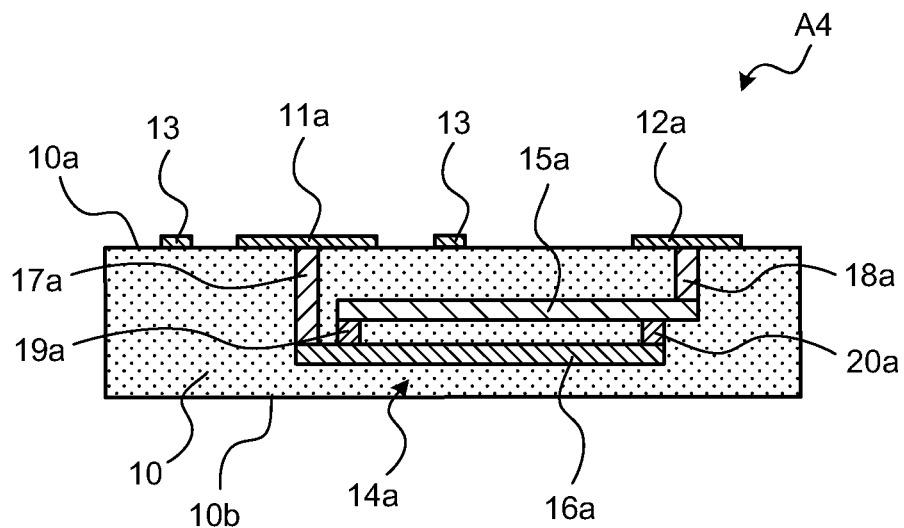
FIG. 4 is a cross-sectional view of a substrate for mounting a light-emitting element according to modification 3 of an embodiment.

A substrate for mounting a light-emitting element as illustrated in FIG. 4 is modification 3 of an embodiment and FIG. 4 is a figure that corresponds to FIG. 1B. In modification 3 as illustrated in FIG. 4, configurations of a first conductor 15*a*, a second conductor 16*a*, and a first via conductor 17*a* are different from those of modification 2 as described above.

Specifically, while one end side of the first conductor 15*a* does not reach a lower side of the first via conductor 17*a*, one end side of the second conductor 16*a* reaches the lower side of the first via conductor 17*a*. Then, the first via conductor 17*a* is not connected to the first conductor 15*a* but is connected to the second conductor 16*a*.

In other words, a wiring part 14*a* in modification 3 has the first via conductor 17*a* that connects a terminal for an element 11*a* and the second conductor 16*a*, a second via conductor 18*a* that connects a terminal for a power source 12*a* and the first conductor 15*a*, and a third via conductor 19*a* and a fourth via conductor 20*a* that connect the first conductor 15*a* and the second conductor 16*a*.

Thereby, it is possible to match lengths of two wirings that are formed in parallel in the wiring part 14*a*. Specifically, it is possible to match a length of a wiring that sequentially wire-connects the first via conductor 17*a*, the second conductor 16*a*, the third via conductor 19*a*, the first conductor 15*a*, and the second via conductor 18*a* and a length of a wiring that sequentially wire-connects the first via conductor 17*a*, the second conductor 16*a*, the fourth via conductor 20*a*, the first conductor 15*a*, and the second via conductor 18*a*.

Thereby, when a light-emitting element 30 is pulse-driven by an external power source, it is possible to prevent or reduce causing of a phase difference in a pulsed current.

Therefore, according to modification 3, it is possible to improve a grade of light emission of a light-emitting device.

Additionally, although FIG. 4 illustrates an example where the first via conductor 17a is connected to the second conductor 16a and the second via conductor 18a is connected to the first conductor 15a, the first via conductor 17a may be connected to the first conductor 15a and the second via conductor 18a may be connected to the second conductor 16a.

That is, in modification 3, it is sufficient that the first via conductor 17a is connected to the terminal for an element 11a and one of the first conductor 15a and the second conductor 16a and the second via conductor 18a is connected to the terminal for a power source 12a and another of the first conductor 15a and the second conductor 16a.

Figure 5:
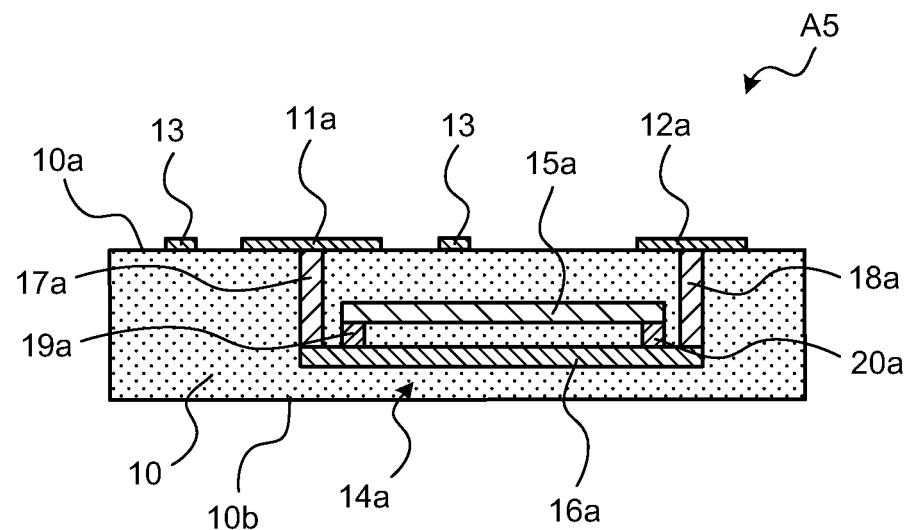
FIG. 5 is a cross-sectional view of a substrate for mounting a light-emitting element according to modification 4 of an embodiment.

A substrate for mounting a light-emitting element as illustrated in FIG. 5 is modification 4 of an embodiment and FIG. 5 is a figure that corresponds to FIG. 1B. In modification 4 as illustrated in FIG. 5, configurations of a first conductor 15a, a second conductor 16a, and a second via conductor 18a are different from those of modification 3 as described above.

Specifically, while another end side of the first conductor 15a does not reach a lower side of the second via conductor 18a, another end side of the second conductor 16a reaches the lower side of the second via conductor 18a. Then, the second via conductor 18a is not connected to the first conductor 15a but is connected to the second conductor 16a.

In other words, a wiring part 14a in modification 4 has a first via conductor 17a that connects a terminal for an element 11a and the second conductor 16a, the second via conductor 18a that connects a terminal for a power source 12a and the second conductor 16a, and a third via conductor 19a and a fourth via conductor 20a that connect the first conductor 15a and the second conductor 16a.

Thereby, at a part near the terminal for an element 11a or the terminal for a power source 12a, it is possible to provide the wiring part 14a with a single wire structure with an equal length or thickness. Therefore, according to modification 4, when a light-emitting element 30 is pulse-driven by an external power source, it is possible to prevent or reduce a variation of a pulsed current.

Furthermore, in modification 4, when another mounting component such as an IC is packaged on a side of a front surface 10a or a side of a back surface 10b of a substrate 10, it is possible to increase a distance between a packaging surface and the first conductor 15a. Therefore, according to modification 4, it is possible to reduce an influence of a noise from another mounting component.

Figure 6:
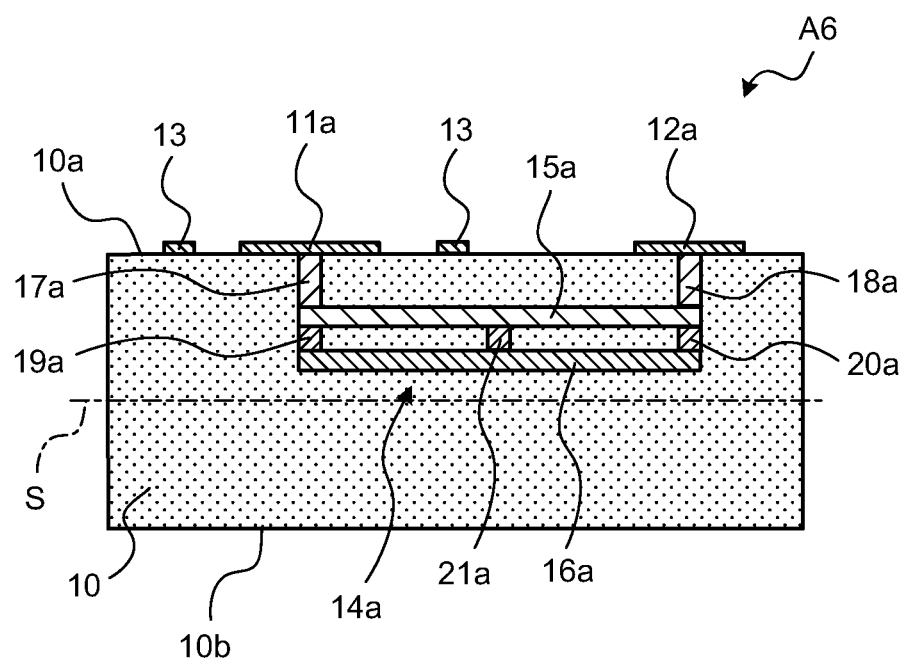
FIG. 6 is a cross-sectional view of a substrate for mounting a light-emitting element according to modification 5 of an embodiment.

A substrate for mounting a light-emitting element A6 as illustrated in FIG. 6 is modification 5 of an embodiment and FIG. 6 is a figure that corresponds to FIG. 1B. In modification 5 as illustrated in FIG. 6, in a case where a substrate 10 is bisected in a thickness direction thereof, any of a first conductor 15a and a second conductor 16a is arranged on a side of a front surface 10a.

In other words, as illustrated in FIG. 6, in a case where a cross section S is defined that bisects the substrate 10 in a thickness direction thereof, any of the first conductor 15a and the second conductor 16a is arranged between such a cross section S and the front surface 10a.

Thereby, it is possible to decrease a total length of a wiring part 14a that is connected between a terminal for an element 11a and a terminal for a power source 12a. Therefore, according to modification 5, it is possible to further reduce a wiring inductance of the wiring part 14a.

Figure 7A:
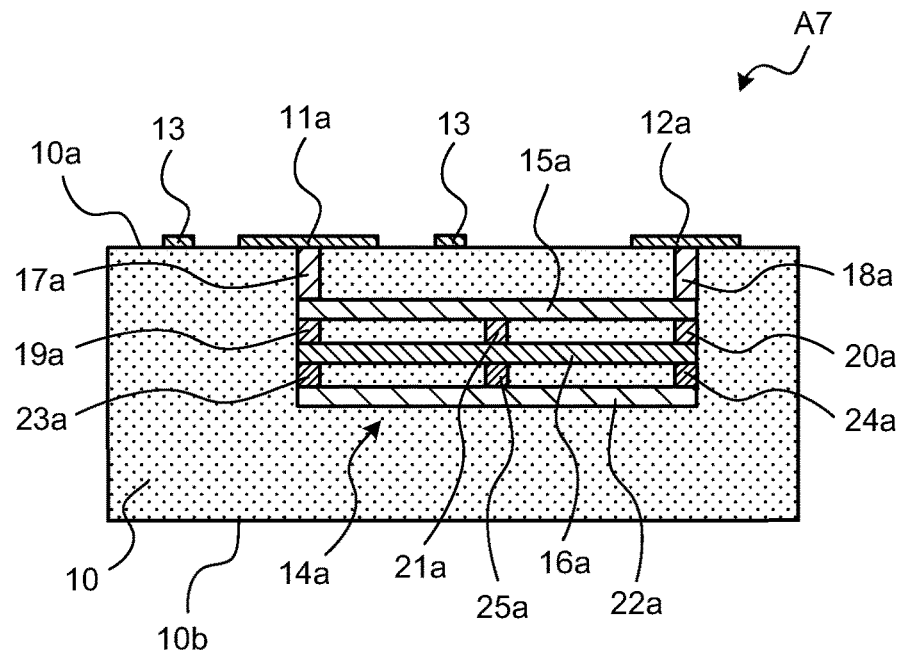
FIG. 7A is a cross-sectional view of a substrate for mounting a light-emitting element according to modification 6 of an embodiment.
Figure 7B:
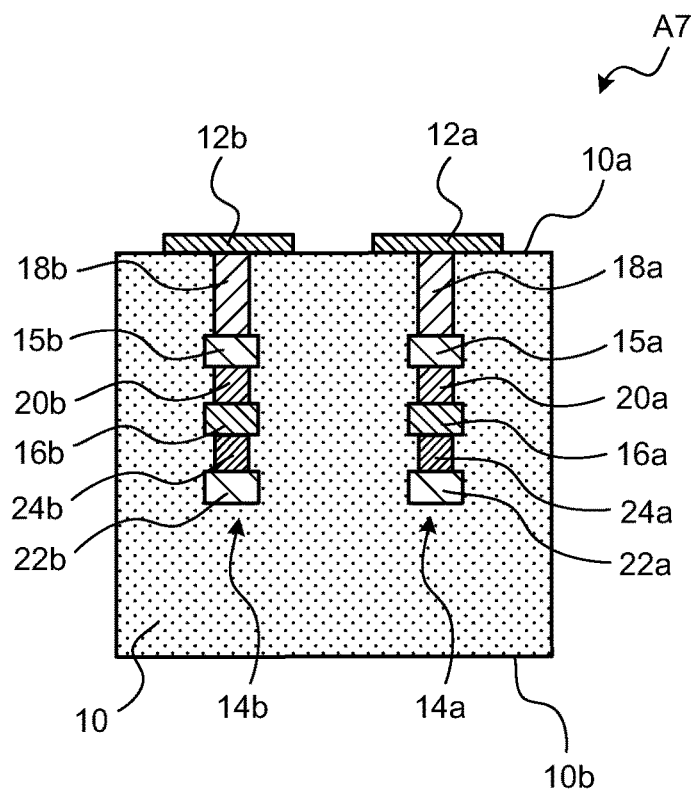
FIG. 7B is another cross-sectional view of a substrate for mounting a light-emitting element according to modification 6 of an embodiment.

A substrate for mounting a light-emitting element A7 as illustrated in FIG. 7A and FIG. 7B is modification 6 of an embodiment. Additionally, FIG. 7A is a figure that corresponds to FIG. 1B and FIG. 7B is a figure that corresponds to FIG. 1E. In modification 6 as illustrated in FIG. 7A and FIG. 7B, a third conductor 22a is further provided in addition to a first conductor 15a and a second conductor 16a.

Such a third conductor 22a extends in substantially parallel to the second conductor 16a on an opposite side of a front surface 10a and is connected in parallel with the second conductor 16a through a sixth via conductor 23a and a seventh via conductor 24a.

Then, in modification 6, a wiring part 14a that is formed by three parallel wirings is connected between a terminal for an element 11a and a terminal for a power source 12a, so that it is possible to further reduce a wiring inductance of the wiring part 14a.

Furthermore, in modification 6, it is possible to further increase a cross-sectional area of a site of the wiring part 14a that extends in a surface direction (that is, the first conductor 15a, the second conductor 16a, and the third conductor 22a). Therefore, according to modification 6, it is possible to further reduce a wiring resistance of the wiring part 14a.

Furthermore, in modification 6, the first conductor 15a, the second conductor 16a, and the third conductor 22a are arranged in such a manner that both parts with a less thickness face one another in upward and downward directions. Thereby, it is possible to provide the first conductor 15a, the second conductor 16a, and the third conductor 22a closely in a thickness direction of a substrate 10. Therefore, according to modification 6, it is possible to further reduce a wiring inductance of the wiring part 14a.

Furthermore, in modification 6, the first conductor 15a, the second conductor 16a, and the third conductor 22a are formed so as to be of a ladder shape in a cross-sectional view, so that it is possible to further decrease deformation of an inside of the substrate 10 in a thickness direction thereof.

Therefore, according to modification 6, it is possible to prevent or reduce a variation of an optical axis of a light-emitting element 30 that is mounted on the terminal for an element 11a in a light-emitting device, in a thickness direction.

Furthermore, in modification 6, the third conductor 22a is arranged at a position that is closer to a back surface 10b, so that it is possible to cause heat that is generated from the light-emitting element 30 that is mounted on the terminal for an element 11a to escape to the back surface 10b with a high heat release property more efficiently.

Therefore, according to modification 6, in a case where a heat release member of a fin type or the like is placed on the back surface 10b, it is possible to further increase a thermal conductivity to such a heat release member.

Furthermore, in modification 6, a site that extends in a surface direction of the wiring part 14a is divided into the first conductor 15a, the second conductor 16a, and the third conductor 22a and a ceramic site is present therebetween, so that it is possible to further reduce a stress that is generated between a set of the first conductor 15a, the second conductor 16a, and the third conductor 22a, and the substrate 10.

Therefore, according to modification 6, it is possible to further improve a reliability of the substrate for mounting a light-emitting element A7.

Furthermore, in an embodiment, a via conductor other than the sixth via conductor 23a and the seventh via conductor 24a may be connected between the second conductor 16a and the third conductor 22a. For example, as illustrated in FIG. 7A, an eighth via conductor 25a may be connected between a middle part of the second conductor 16a and a middle part of the third conductor 22a. Thereby, it is possible to further equalize a current that flows through the second conductor 16a and a current that flows through the third conductor 22a.

Manufacturing Method for Substrate for Mounting a Light-Emitting Element

Figure 9:
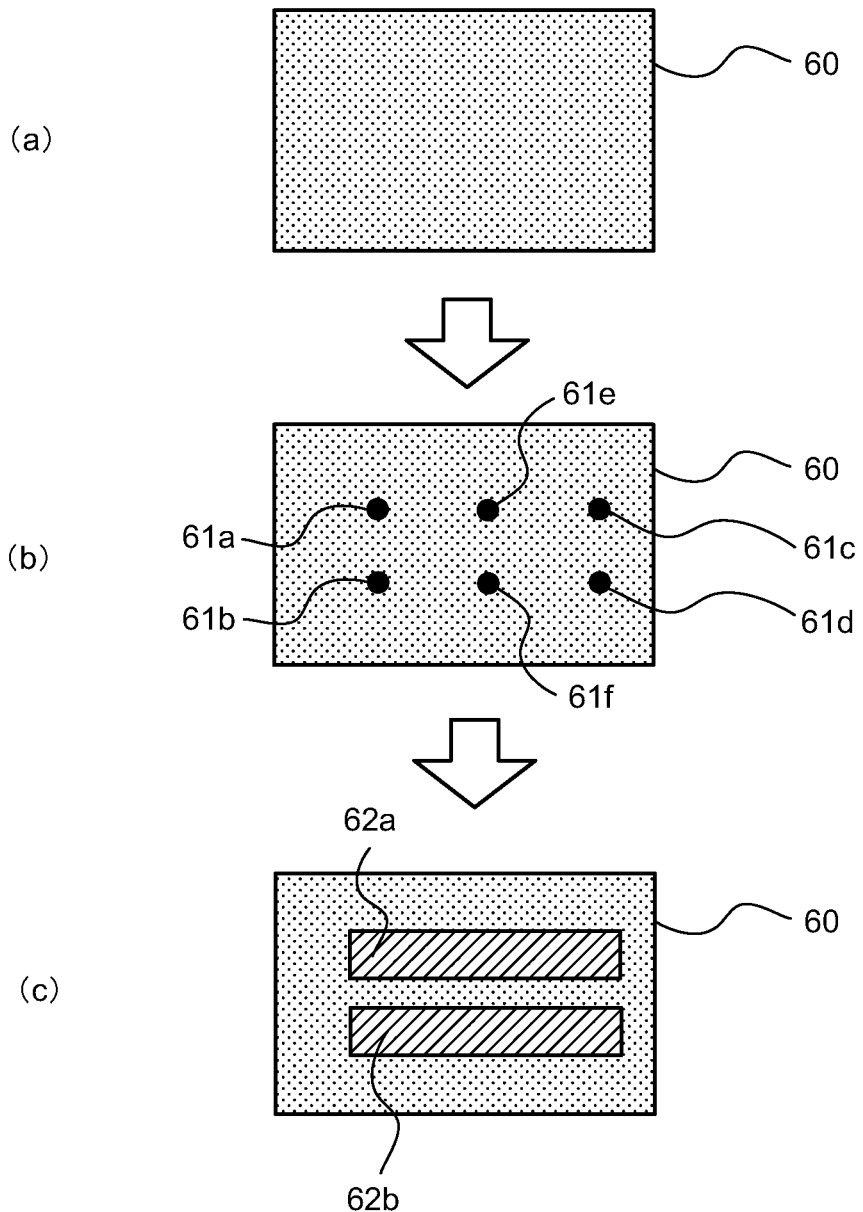
FIG. 9 is a plan view that illustrates another manufacturing process for a substrate for mounting a light-emitting element according to an embodiment.
Figure 10:
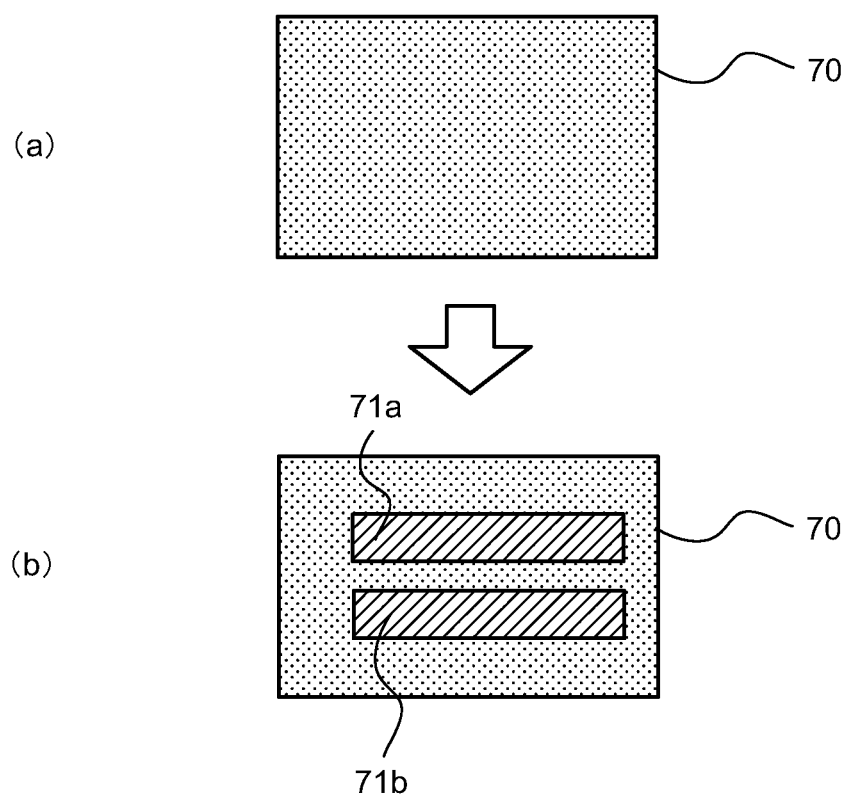
FIG. 10 is a plan view that illustrates another manufacturing process for a substrate for mounting a light-emitting element according to an embodiment.
Figure 11:
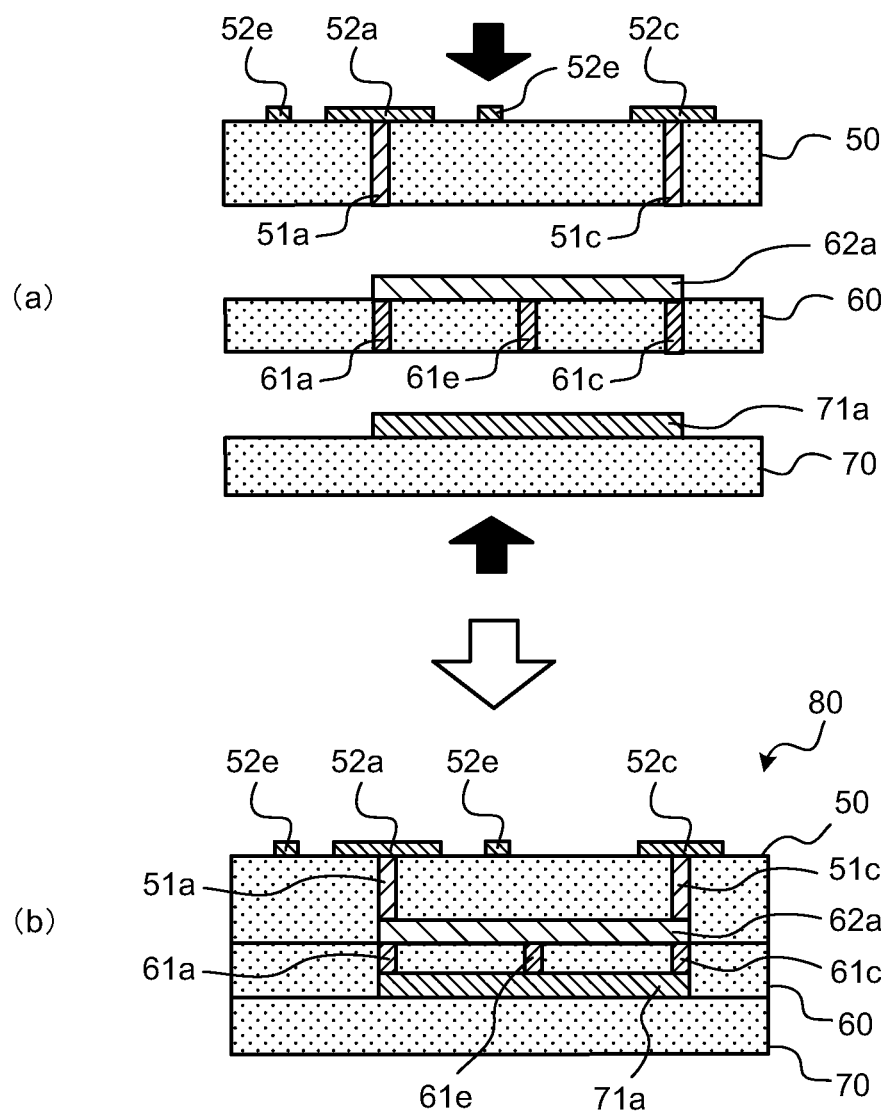
FIG. 11 is a cross-sectional view that illustrates another manufacturing process for a substrate for mounting a light-emitting element according to an embodiment.

Next, a manufacturing method for a substrate for mounting a light-emitting element A1 according to an embodiment will be explained with reference to FIG. 8 to FIG. 11. Additionally, FIGS. 8 to 10 are plan views where respective steps in a first half are viewed from above respectively and FIG. 11 is a cross-sectional view where respective steps in a second half are provided in a cross-sectional view from a side respectively.

A substrate for mounting a light-emitting element A1 is formed by respectively applying a predetermined process to three green sheets, subsequently laminating the three green sheets, and finally firing a laminated molded body.

Hereinafter, among three green sheets, each step in a first half for a green sheet 50 as an upper layer will be explained based on FIG. 8 that is provided as a plan view, each step in a first half for a green sheet 60 as a middle layer will be explained based on FIG. 9 that is provided as a plan view, and each step in a first half for a green sheet 70 as a lower layer will be explained based on FIG. 10 that is provided as a plan view. Finally, each step in a second half for the green sheets 50, 60, 70 will be explained based on FIG. 11 that is provided as a cross-sectional view.

Figure 8:
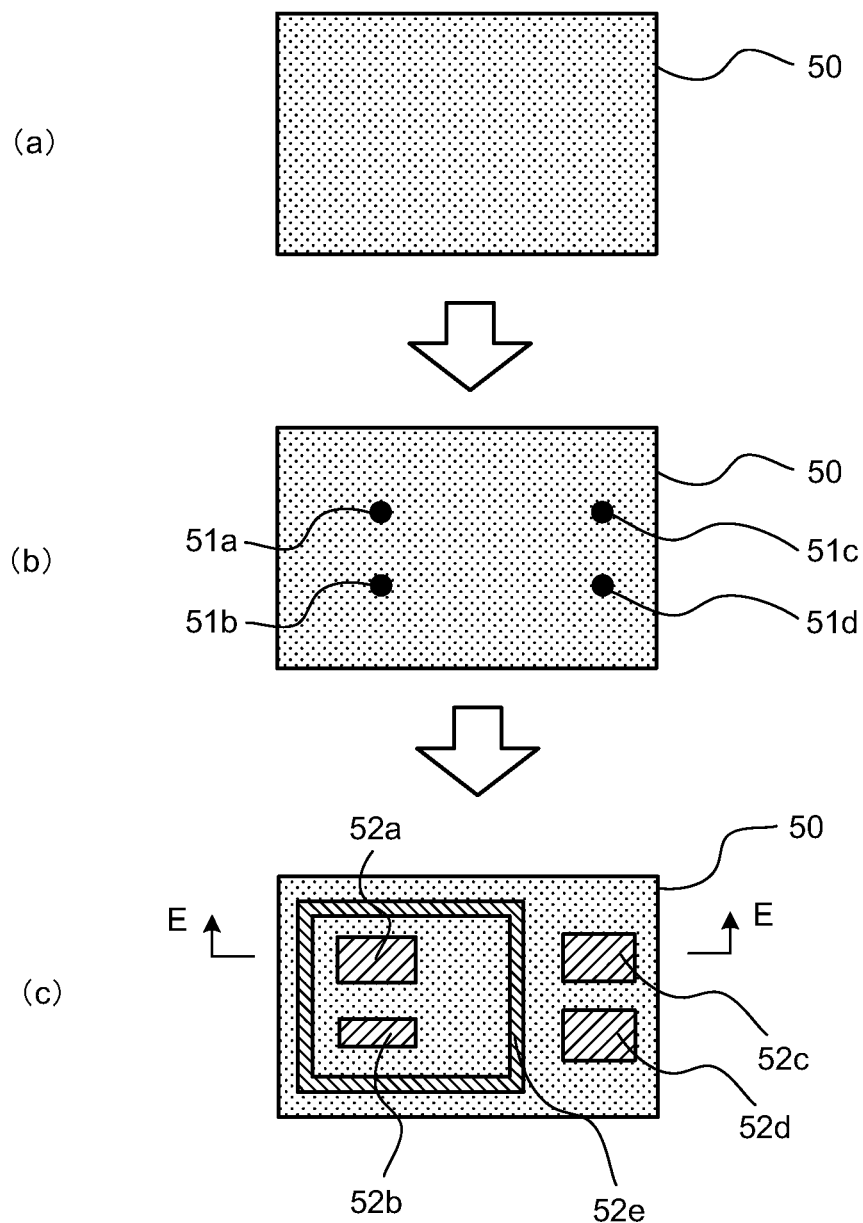
FIG. 8 is a plan view that illustrates a manufacturing process for a substrate for mounting a light-emitting element according to an embodiment.

As illustrated in (a) of FIG. 8, the green sheet 50 is prepared that is preliminarily processed into a predetermined shape. Then, a four predetermined locations on the green sheet 50 are punched into circular shapes in a plan view and four punched holes are respectively filled with via conductors 51a, 51b, 51c, 51d ((b) of FIG. 8).

Then, as illustrated in (c) of FIG. 8, on a top surface of the green sheet 50, a conductor pattern 52a is printed so as to be linked to the via conductor 51a and a conductor pattern 52b is printed so as to be linked to the via conductor 51b. Furthermore, simultaneously, a conductor pattern 52c is printed so as to be linked to the via conductor 51c and a conductor pattern 52d is printed so as to be linked to the via conductor 51d. Moreover, simultaneously, a conductor pattern 52e with a frame shape is printed so as to surround the conductor patterns 52a, 52b.

Furthermore, as illustrated in (a) of FIG. 9, the green sheet 60 is prepared that is preliminarily processed into a predetermined shape. Then, six predetermined locations on the green sheet 60 are punched into circular shapes in a plan view and six punched holes are respectively filled with via conductors 61a, 61b, 61c, 61d, 61e, 61f ((b) of FIG. 9).

Then, as illustrated in (c) of FIG. 9, on a top surface of the green sheet 60, a conductor pattern 62a is printed so as to be linked to the via conductors 61a, 61c, 61e and a conductor pattern 62b is printed so as to be linked to the via conductors 61b, 61d, 61f.

Furthermore, as illustrated in (a) of FIG. 10, the green sheet 70 is prepared that is preliminarily processed into a predetermined shape. Then, as illustrated in (b) of FIG. 10, on a top surface of the green sheet 70, conductor patterns 71a, 71b are printed. Additionally, the conductor pattern 71a is formed at a position that corresponds to the via conductors 61a, 61c, 61e that are provided on the green sheet 60 and the conductor pattern 71b is formed at a position that corresponds to the via conductors 61b, 61d, 61f that are provided on the green sheet 60.

FIG. 11 that illustrates subsequent steps is a cross-sectional view that is viewed along an arrow of line E-E as illustrated in (c) of FIG. 8. As illustrated in (a) of FIG. 11, the green sheet 50, the green sheet 60, and the green sheet 70 are sequentially laminated from above, and heating and pressurizing are executed to form a lamination molded body 80 ((b) of FIG. 11).

Herein, the conductor patterns 52a, 52c, 52e are sites that correspond to a terminal for an element 11a, a terminal for a power source 12a, and a metal film for sealing 13 of the substrate for mounting a light-emitting element A1, respectively, and the via conductors 51a, 51c are sites that correspond to a first via conductor 17a and a second via conductor 18a of the substrate for mounting a light-emitting element A1, respectively.

Furthermore, the conductor pattern 62a is a site that corresponds to a first conductor 15a of the substrate for mounting a light-emitting element A1 and the via conductors 61a, 61c, 61e are sites that correspond to a third via conductor 19a, a fourth via conductor 20a, and a fifth via conductor 21a of the substrate for mounting a light-emitting element A1, respectively. Moreover, the conductor pattern 71a is a site that corresponds to a second conductor 16a of the substrate for mounting a light-emitting element A1.

Additionally, although illustration is not provided in FIG. 11, the conductor patterns 52b, 52d are sites that correspond to a terminal for an element 11b and a terminal for a power source 12b of the substrate for mounting a light-emitting element A1, respectively, and the via conductors 51b, 51d are sites that correspond to a first via conductor 17b and a second via conductor 18b of the substrate for mounting a light-emitting element A1, respectively.

Furthermore, the conductor pattern 62b is a site that corresponds to a first conductor 15b of the substrate for mounting a light-emitting element A1 and the via conductors 61b, 61d, 61f are sites that correspond to a third via conductor 19b, a fourth via conductor 20b, and a fifth via conductor 21b of the substrate for mounting a light-emitting element A1, respectively. Moreover, the conductor pattern 71b is a site that corresponds to a second conductor 16b of the substrate for mounting a light-emitting element A1.

Then, at an end of a manufacturing process, the lamination molded body 80 that is formed like (b) of FIG. 11 is fired at a high temperature (1700° C. to 2000° C.), so that the substrate for mounting a light-emitting element A1 is completed.

A basic structure for the green sheets 50, 60, 70 that are used in a manufacturing process as described above is, for example, an inorganic powder where a powder that is composed of yttria ($Y_2O_3$), calcia (CaO), erbia ($Er_2O_3$), or the like, as a sintering aid, is mixed to a powder of aluminum nitride that is a main raw material. Then, an organic vehicle is added and mixed to such an inorganic powder so as to be slurry-like and a conventionally well-known doctor blade method or calendar roll method is used for it, so that the green sheet 50 is formed.

Furthermore, the conductor patterns 52a to 52e, 62a, 62b, 71a, 71b or the via conductors 51a to 51d, 61a to 61f are formed from, for example, a paste where aluminum nitride, an organic binder, a solvent, or the like, as a co-agent, is mixed to molybdenum (Mo) or tungsten (W) as a high-melting-point metal that is a main raw material. Additionally, a low-melting-point metal such as copper that is included in a high-melting-point metal as described above may be used depending on a firing temperature of a ceramic (s).

Additionally, it is also possible to fabricate substrates for mounting a light-emitting element A2 to A7 as described above similarly by changing arrangement of a via conductor and a conductor pattern or the like.

Although an embodiment of the present invention has been explained above, the present invention is not limited to an embodiment as described above and a variety of modifications are allowed unless departing from a spirit thereof. For example, although an example where the wiring part 14a is composed of a two-layered structure (an embodiment and modifications 1 to 5) or a three-layered structure (modification 6) is illustrated in an embodiment and modifications as described above, the wiring part 14a may be composed of a four-or-more-layered structure.

Furthermore, although an example where the terminals for a power source 12a, 12b are provided on the front surface 10a of the substrate 10 is illustrated in an embodiment as described above, positions where the terminals for a power source 12a, 12b are provided thereat are not limited to the front surface 10a of the substrate 10 and it is sufficient that they are provided on a surface of the substrate 10 such as the back surface 10b, the end surface 10c, or the side surface 10d of the substrate 10.

Furthermore, although the light-emitting element 30 or the like is air-tightly sealed by using the cap 40 in an embodiment as described above, an air-tightly sealing member is not limited to the cap 40. For example, the light-emitting element 30 or the like may be air-tightly sealed by combining a seal ring (a sealing member) with a frame shape where a side window is provided at a predetermined position, and a lid body with a plate shape.

As provided above, a substrate for mounting a light-emitting element A1 (A2 to A7) according to an embodiment includes a substrate 10 that is composed of a ceramic(s), a terminal for an element 11a that is provided on a front surface 10a of the substrate 10 where a light-emitting element 30 is mounted thereon, a terminal for a power source 12a that is provided on the substrate 10 where an external power source is connected thereto, and a wiring part 14a that is provided inside the substrate 10 and electrically connects the terminal for an element 11a and the terminal for a power source 12a. Furthermore, the wiring part 14a has a first conductor 15a that extends in a surface direction of the substrate 10 and a second conductor 16a that extends in substantially parallel to the first conductor 15a on an opposite side of the front surface 10a and is connected in parallel with the first conductor 15a. Thereby, it is possible to prevent or reduce a variation in an output of light emission of a light-emitting element 30.

Furthermore, in the substrate for mounting a light-emitting element A1 (A2, A3, A6, A7) according to an embodiment, the wiring part 14a has a first via conductor 17a that extends in a thickness direction of the substrate 10 and connects the terminal for an element 11a and the first conductor 15a, a second via conductor 18a that extends in a thickness direction of the substrate 10 and connects the terminal for a power source 12a and the first conductor 15a, and a third via conductor 19a and a fourth via conductor 20a that extend in a thickness direction of the substrate 10 and connect the first conductor 15a and the second conductor 16a. Thereby, it is possible to reduce a wiring inductance of a wiring part 14a.

Furthermore, in the substrate for mounting a light-emitting element A1 (A2, A6, A7) according to an embodiment, in a case where the substrate 10 is provided in a top view, the first via conductor 17a and the third via conductor 19a are arranged at substantially identical positions and the second via conductor 18a and the fourth via conductor 20a are arranged at substantially identical positions. Thereby, it is possible to increase lengths of sites of a wiring part 14a that are connected in parallel by a first conductor 15a and a second conductor 16a, so that it is possible to further reduce a wiring inductance of the wiring part 14a.

Furthermore, in the substrate for mounting a light-emitting element A3 (A4, A5) according to an embodiment, in a case where the substrate 10 is provided in a top view, the first via conductor 17a and the third via conductor 19a are arranged at different positions and the second via conductor 18a and the fourth via conductor 20a are arranged at different positions. Thereby, it is possible to provide a wiring part 14a with a single wire structure with an equal length or thickness at a part near a terminal for an element 11a or a terminal for a power source 12a, so that, when a light-emitting element 30 is pulse-driven by an external power source, it is possible to prevent or reduce a variation of a pulsed current.

Furthermore, in the substrate for mounting a light-emitting element A4 according to an embodiment, the wiring part 14a has a first via conductor 17a that extends in a thickness direction of the substrate 10 and connects the terminal for an element 11a and one of the first conductor 15a and the second conductor 16a, a second via conductor 18a that extends in a thickness direction of the substrate 10 and connects the terminal for a power source 12a and another of the first conductor 15a and the second conductor 16a, and a third via conductor 19a and a fourth via conductor 20a that extend in a thickness direction of the substrate 10 and connect the first conductor 15a and the second conductor 16a. Thereby, when a light-emitting element 30 is pulse-driven by an external power source, it is possible to prevent or reduce causing of a phase difference in a pulsed current, so that it is possible to improve a grade of light emission of a light-emitting device.

Furthermore, in the substrate for mounting a light-emitting element A4 according to an embodiment, lengths of the first conductor 15a that extends between the third via conductor 19a and the fourth via conductor 20a and the second conductor 16a that extends between the third via conductor 19a and the fourth via conductor 20a are substantially equal. Thereby, when a light-emitting element 30 is pulse-driven by an external power source, it is possible to prevent or reduce causing of a phase difference in a pulsed current, so that it is possible to improve a grade of light emission of a light-emitting device.

Furthermore, in the substrate for mounting a light-emitting element A5 according to an embodiment, the wiring part 14a has a first via conductor 17a that extends in a thickness direction of the substrate 10 and connects the terminal for an element 11a and the second conductor 16a, a second via conductor 18a that extends in a thickness direction of the substrate 10 and connects the terminal for a power source 12a and the second conductor 16a, and a third via conductor 19a and a fourth via conductor 20a that extend in a thickness direction of the substrate 10 and connect the first conductor 15a and the second conductor 16a. Thereby, when a light-emitting element 30 is pulse-driven by an external power source, it is possible to prevent or reduce a variation of a pulsed current.

Furthermore, in the substrate for mounting a light-emitting element A2 according to an embodiment, a width of the second conductor 16a is greater than that of the first conductor 15a. Thereby, it is possible to further improve a reliability of a substrate for mounting a light-emitting element A2.

Furthermore, in the substrate for mounting a light-emitting element A6 according to an embodiment, in a case where the substrate 10 is bisected in a thickness direction thereof, any of the first conductor 15a and the second conductor 16a is arranged on a side of the front surface 10a. Thereby, it is possible to further reduce a wiring inductance of a wiring part 14a.

Furthermore, in the substrate for mounting a light-emitting element A7 according to an embodiment, the wiring part 14a has a third conductor 22a that extends in substantially parallel to the second conductor 16a on an opposite side of the front surface 10a and is connected in parallel with the second conductor 16a. Thereby, it is possible to further reduce a wiring resistance of a wiring part 14a.

Furthermore, a light-emitting device according to an embodiment includes the substrate for mounting a light-emitting element A1 (A2 to A7) as described above, and a light-emitting element 30 that is mounted on the terminal for an element 11a of the substrate for mounting a light-emitting element A1 (A2 to A7). Thereby, it is possible to realize a light-emitting device where a wiring inductance of a wiring part 14a is reduced.

It is possible for a person skilled in the art to readily derive additional effects or modifications. Hence, broader aspects of the present invention are not limited to specific details and representative embodiments as illustrated and described above. Therefore, various modifications are possible without departing from the spirit or scope of a general inventive concept that is defined by the appended claims and equivalents thereof.

REFERENCE SIGNS LIST

A1 to A7 substrate for mounting a light-emitting element substrate
10a front surface
10b back surface
11a, 11b terminal for an element
12a, 12b terminal for a power source
13 metal film for sealing
14a, 14b wiring part
15a, 15b first conductor
16a, 16b second conductor
17a, 17b first via conductor
18a, 18b second via conductor
19a, 19b third via conductor
20a, 20b fourth via conductor
22a, 22b third conductor
30 light-emitting element
30a emitting surface
40 cap
41 side window

The invention claimed is:

1. A substrate for mounting a light-emitting element, comprising:
 a substrate composed of ceramic;
 an element terminal that is provided on a front surface of the substrate and on which a light-emitting element is mounted;
 a power source terminal that is provided on the substrate and connected to an external power source; and
 a wiring part that is provided inside the substrate, electrically connects the element terminal and the power source terminal,
 and includes:
  a first conductor that extends in a surface direction of the substrate; and
  a second conductor that extends substantially parallel to the first conductor on an opposite side of the front surface and is connected in parallel with the first conductor, wherein
 a width of the second conductor is greater than a width of the first conductor, the corresponding width being a length in a direction perpendicular to a longitudinal direction of each of the first conductor and the second conductor in a case where a direction from the element terminal toward the power source terminal is the longitudinal direction.

2. The substrate for mounting a light-emitting element according to claim 1, wherein, in a case where the substrate is bisected in a thickness direction thereof, any of the first conductor and the second conductor is arranged on a side of the front surface.

3. The substrate for mounting a light-emitting element according to claim 1, wherein the wiring part includes a third conductor that extends substantially parallel to the second conductor on an opposite side of the front surface and is connected in parallel with the second conductor.

4. A light-emitting device, comprising:
 the substrate according to claim 1;
 the light-emitting element mounted on the element terminal of the substrate; and
 a cap that covers the light-emitting element and the cap is bonded to the front surface.

5. A substrate for mounting a light-emitting element, comprising:
 a substrate composed of ceramic;
 a first element terminal that is provided on a front surface of the substrate and to which a light-emitting element is connected;
 a second element terminal that is provided on the front surface of the substrate to which the light-emitting element is connected;
 a first power source terminal that is provided on the substrate and connected to an external power source;
 a second power source terminal that is provided on the substrate and connected to an external power source;
 a first wiring part that is provided inside the substrate, and electrically connects the first element terminal and the first power source terminal; and
 a second wiring part that is provided inside the substrate, and electrically connects the second element terminal and the second power source terminal, wherein the first wiring part includes:
  a first conductor that extends in a surface direction of the substrate; and
  a second conductor that extends substantially parallel to the first conductor on an opposite side of the front surface and is connected in parallel with the first conductor, and
 the second wiring part includes:
  a third conductor that extends in the surface direction of the substrate; and
  a fourth conductor that extends substantially parallel to the third conductor on an opposite side of the front surface and is connected in parallel with the third conductor,
 a width of the second conductor is greater than a width of the first conductor, the corresponding width being a length in a direction perpendicular to a longitudinal direction of each of the first conductor and the second conductor in a case where a direction from the element terminal toward the power source terminal is the longitudinal direction, a width of the fourth conductor is greater than a width of the third conductor, the corresponding width being a length in a direction perpendicular to a longitudinal direction of each of the third conductor and the fourth conductor in a case where the direction from the element terminal toward the power source terminal is the longitudinal direction, and a wiring length of the first wiring part is equal to a wiring length of the second wiring part.

6. The substrate for mounting a light-emitting element according to claim 1, wherein the wiring part includes:
   a first via conductor that extends in a thickness direction of the substrate and connects the element terminal and the first conductor;
   a second via conductor that extends in the thickness direction of the substrate and connects the power source terminal and the first conductor; and
   a third via conductor and a fourth via conductor that extend in the thickness direction of the substrate and connect the first conductor and the second conductor.

7. The substrate for mounting a light-emitting element according to claim 6, wherein, when the substrate is viewed from above, the first via conductor and the third via conductor are arranged at substantially identical positions, and the second via conductor and the fourth via conductor are arranged at substantially identical positions.

8. The substrate for mounting a light-emitting element according to claim 6, wherein, when the substrate is viewed from above, the first via conductor and the third via conductor are arranged at different positions, and the second via conductor and the fourth via conductor are arranged at different positions.

9. The substrate for mounting a light-emitting element according to claim 1, wherein the wiring part includes:
   a first via conductor that extends in a thickness direction of the substrate and connects the element terminal and one of the first conductor and the second conductor;
   a second via conductor that extends in the thickness direction of the substrate and connects the power source terminal and another of the first conductor and the second conductor; and
   a third via conductor and a fourth via conductor that extend in the thickness direction of the substrate and connect the first conductor and the second conductor.

10. The substrate for mounting a light-emitting element according to claim 9, wherein a length of the first conductor that extends between the third via conductor and the fourth via conductor and a length of the second conductor that extends between the third via conductor and the fourth via conductor are substantially equal.

11. The substrate for mounting a light-emitting element according to claim 1, wherein the wiring part includes:
   a first via conductor that extends in a thickness direction of the substrate and connects the element terminal and the second conductor;
   a second via conductor that extends in the thickness direction of the substrate and connects the power source terminal and the second conductor; and
   a third via conductor and a fourth via conductor that extend in the thickness direction of the substrate and connect the first conductor and the second conductor.

\* \* \* \* \*